(12) United States Patent
Jung

(10) Patent No.: US 7,267,924 B2
(45) Date of Patent: Sep. 11, 2007

(54) TOP ANTI-REFLECTIVE COATING POLYMER, ITS PREPARATION METHOD AND TOP ANTI-REFLECTIVE COATING COMPOSITION COMPRISING THE SAME

(75) Inventor: Jae-chang Jung, Seoul (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 0 days.

(21) Appl. No.: 11/099,166

(22) Filed: Apr. 5, 2005

(65) Prior Publication Data

US 2005/0238991 A1    Oct. 27, 2005

(30) Foreign Application Priority Data

Apr. 27, 2004    (KR) .................... 10-2004-0029088

(51) Int. Cl.
  *G03C 1/825*    (2006.01)
  *G03F 7/30*    (2006.01)
  *C08F 222/02*    (2006.01)
  *C08F 221/10*    (2006.01)
  *C08F 118/02*    (2006.01)

(52) U.S. Cl. .................. 430/273.1; 430/325; 430/326; 526/310; 526/317.1; 526/319

(58) Field of Classification Search .................... None
  See application file for complete search history.

(56) References Cited

U.S. PATENT DOCUMENTS

| | | | | |
|---|---|---|---|---|
| 5,484,610 | A | * | 1/1996 | Bae .............. 424/487 |
| 5,879,853 | A | | 3/1999 | Azuma |
| 6,057,080 | A | | 5/2000 | Brunsvold et al. |
| 6,228,352 | B1 | * | 5/2001 | Leet ............ 424/70.16 |
| 6,274,295 | B1 | | 8/2001 | Dammel et al. |
| 2003/0219682 | A1 | | 11/2003 | Wakiya et al. |

\* cited by examiner

*Primary Examiner*—Rosemary Ashton
(74) *Attorney, Agent, or Firm*—Marshall, Gerstein & Borun LLP

(57) ABSTRACT

Disclosed herein are a top anti-reflective coating polymer used in a photolithography process, which is one of the fabrication processes for a semiconductor device, a method for preparing the anti-reflective coating polymer, and an anti-reflective coating composition comprising the anti-reflective coating polymer. Specifically, the top anti-reflective coating polymer is used in immersion lithography for the fabrication of a sub-50 nm semiconductor device. The top anti-reflective coating polymer is represented by Formula 1 below:

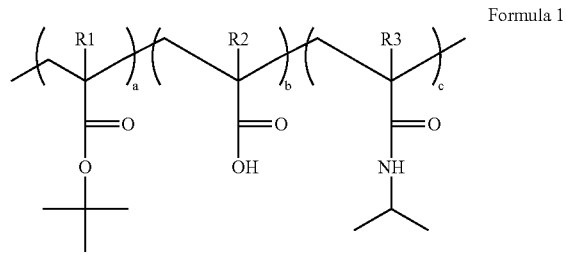

Formula 1 wherein R1, R2 and R3 are independently hydrogen or a methyl group; and a, b and c represent the mole fraction of each monomer, and are in the range between about 0.05 and about 0.9. Since a top anti-reflective coating formed using the above anti-reflective coating polymer is not soluble in water, it can be applied to immersion lithography using water as the medium for a light source. In addition, since the top anti-reflective coating can reduce the reflectance from an underlayer, the uniformity of CD is improved, thus enabling the formation of an ultrafine pattern.

10 Claims, 1 Drawing Sheet

TOP ANTI-REFLECTIVE COATING POLYMER, ITS PREPARATION METHOD AND TOP ANTI-REFLECTIVE COATING COMPOSITION COMPRISING THE SAME

BACKGROUND

1. Technical Field

An anti-reflective coating polymer usable in immersion lithography for the fabrication of a sub-50 nm semiconductor device, a method for preparing the anti-reflective coating polymer, and an anti-reflective coating composition comprising the anti-reflective coating polymer are disclosed 2. Discussion of the Related Art Photolithography is a process for the transfer of a semiconductor circuit pattern formed on a photomask to a wafer, and is one of the most important fabrication steps in determining the fineness and integration density of circuits of semiconductor devices.

In recent years, as the integration density of semiconductor devices has increased, new fine processing techniques have been developed. However, there is an increasing need for a suitable fine photolithography processing technique. That is, as the circuit linewidths become finer and finer, the use of short-wavelength light sources for illumination, such as KrF, ArF, F2 and EUV excimer lasers, and high numerical aperture lenses is required. EUV, F2, ArF and KrF lasers are preferentially used as light sources in terms of their short wavelength.

A number of studies on the development of sub-50 nm devices have been actively undertaken. In response to these studies, recent attention has been directed toward the development of suitable processing equipment and materials associated with the use of F2 and EUV as exposure light sources. Technical solutions for the use of F2 are satisfactory to some extent, but there are the following problems: 1) the mass production of high-quality $CaF_2$ within a short time is limited, 2) since soft pellicles are likely to be deformed upon exposure to light at 157 nm, the storage stability is decreased, and 3) hard pellicles incur considerable production cost, and are difficult to produce on a commercial scale due to their nature of light refraction.

On the other hand, suitable light sources, exposure equipment and masks are required to use an EUV laser are not currently available. Accordingly, the formation of finer high-precision photoresist patterns by using a photoresist adapted to the use of an ArF excimer laser has now become a key technical task. Under these circumstances, immersion lithography has recently drawn attention.

Dry lithography is a currently used lithography process, and is an exposure system wherein air is filled between an exposure lens and a wafer. In contrast to dry lithography, immersion lithography, which corresponds to an NA scaling technique, is an exposure system wherein water is filled between an exposure lens and a wafer. Since water (refractive index (n)=1.4) is used as a medium for a light source in the immersion lithography, the NA is 1.4 times larger than that in the dry lithography using air (refractive index (n)=1.0). Accordingly, immersion lithography is advantageous in terms of high resolution.

Problems encountered with the fabrication of a sub-50 nm semiconductor device include alterations in the critical dimension (CD) of a photoresist pattern inevitably takes place, during a process for the formation of an ultrafine pattern, by standing waves, reflective notching, and diffracted and reflected light from an underlayer due to the optical properties of the underlayer on an overlying photoresist and due to the variation in the thickness of the photoresist. To prevent the reflected light from the underlayer, a light-absorbing material, called an "anti-reflective coating" is used as an exposure light source is introduced between the underlayer and the photoresist. A bottom anti-reflective coating is interposed between the underlayer and the photoresist. With the recent increase in the fineness of overlying photoresist patterns, a top anti-reflective coating (TARC) has also been used to prevent the photoresist pattern from being disrupted by the reflected and diffracted light. Specifically, as the miniaturization of semiconductor devices makes overlying photoresist patterns extremely fine, the use of a bottom anti-reflective coating only cannot completely prevent the patterns from being disrupted by scattered reflection. Accordingly, top anti-reflective coatings are used to prevent disruption of the patterns.

However, since conventional top anti-reflective coatings for use in dry lithography are water-soluble (in the case of using KrF or ArF laser), they cannot be applied to immersion lithography as water is used as a medium for a light source in immersion lithography.

Accordingly, an ideal top anti-reflective coating for use in immersion lithography must satisfy the following requirements. First, the top anti-reflective coating must be transparent to a light source. Second, the top anti-reflective coating must have a refractive index between 1.4 and 2.0, depending on the kind of an underlying photosensitive film (i.e. photoresist) to be used. Third, when the top anti-reflective coating composition is coated on an underlying photosensitive film, it must not dissolve the photosensitive film. Fourth, the top anti-reflective coating must not be water soluble upon light exposure. Finally, the top anti-reflective coating must be soluble in a developing solution upon development.

The above-mentioned stringent requirements make the development of a suitable top anti-reflective coating for use in immersion lithography difficult. Thus, there exists a strong need for the development of a top anti-reflective coating for use in immersion lithography which is water-insoluble and can minimize alterations of the CD.

SUMMARY OF THE DISCLOSURE

Therefore, in view of the above problems, a top anti-reflective coating polymer is disclosed which can be used in immersion lithography due to its water insolubility, which can prevent the multiple interference of light inside a photoresist in the formation of a photoresist pattern, and which can inhibit the alteration in the dimensions of the photoresist pattern resulting from the variation in the thickness of the photoresist.

A method for preparing the top anti-reflective coating polymer is also disclosed.

A top anti-reflective coating composition comprising the top anti-reflective coating polymer is also disclosed.

A method for forming a pattern by using the top anti-reflective coating composition is also disclosed.

One disclosed top anti-reflective coating polymer has a weight-average molecular weight of 1,000~1,000,000 and is represented by Formula 1 below:

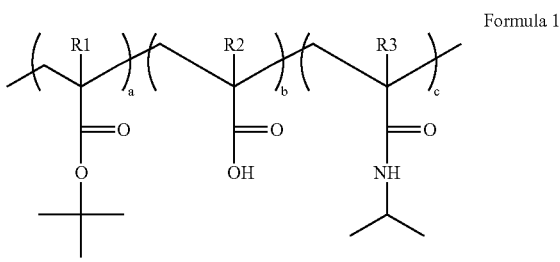

Formula 1 wherein R1, R2 and R3 are independently hydrogen or a methyl group; and a, b and c represent the mole fraction of each monomer, and are in the range of from about 0.05 to about 0.9.

DETAIL DESCRIPTION OF THE PRESENTLY PREFERRED EMBODIMENTS

The disclosed top anti-reflective coating polymer exhibits high light transmission, and thus is suitable for use as a top anti-reflective coating. In addition, since the disclosed top anti-reflective coating polymer is highly soluble in a developing solution after light exposure, it has no effect on the formation of a pattern. Furthermore, since the disclosed top anti-reflective coating polymer is water-insoluble, it can be applied to immersion lithography. Moreover, since the disclosed top anti-reflective coating polymer can prevent scattered reflection from the top of a photoresist, it can effectively prevent a photoresist pattern from being disrupted by the scattered reflection.

Disclosed top anti-reflective coating polymers have a weight-average molecular weight in the range of 1,000~1,000,000, and preferably in the range of 2,000~10,000. Too high a molecular weight causes a decrease in the solubility in a developing solution. As a result, a portion of the anti-reflective coating remains on the photoresist after development, causing contamination of the pattern. On the other hand, too low a molecular weight cannot ensure optimized refractive index of the anti-reflective coating and good overcoating on the photoresist.

The poly(t-butylacrylate-acrylic acid-N-isopropylacrylamide) copolymer represented by Formula 1 can be prepared by dissolving a t-butylacrylate monomer, an acrylic acid monomer and a N-isopropylacrylamide monomer in an organic solvent, adding a polymerization initiator to the solution, and subjecting the mixture to free-radical polymerization at a temperature in the range of 55° C.~65° C. for a time period in the range of 6~12 hours.

Any organic solvent that can be used in free-radical copolymerization can be used. Preferably, the organic solvent is selected from the group consisting of propyleneglycolmethylether acetate (PGMEA), tetrahydrofuran, cyclohexanone, dimethylformamide, dimethylsulfoxide, dioxane, methyl ethyl ketone, ethylacetate, benzene, toluene, xylene, and mixtures thereof. PGMEA is currently preferred.

Further, the polymerization initiator is preferably selected from the group consisting of 2,2'-azobisisobutyronitrile (AIBN), benzoylperoxide, acetylperoxide, laurylperoxide, t-butylperacetate, t-butylhydroperoxide, di-t-butylperoxide and mixtures thereof. The use of 2,2'-azobisisobutyronitrile (AIBN) is currently preferred.

One disclosed top anti-reflective coating composition comprises an effective amount of a top anti-reflective coating polymer with a weight-average molecular weight in the range of 1,000~1,000,000, and which is represented by Formula 1 below:

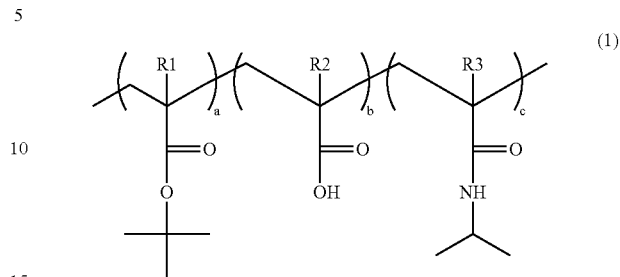

(1)

wherein R1, R2 and R3 are independently hydrogen or a methyl group; and a, b and c represent the mole fraction of each monomer, and are in the range of from about 0.05 to about 0.9.

The disclosed top anti-reflective coating compositions are prepared by dissolving the top anti-reflective coating polymer in n-butanol. The top anti-reflective coating composition thus prepared has an optimal refractive index of 1.4 to 2.0. Accordingly, when the top anti-reflective coating composition is overcoated on top of a photoresist, the reflectance can be minimized and thus the photoresist pattern can be protected from being disrupted by reflected light.

Considering the reflective index and thickness of the anti-reflective coating composition, the n-butanol is preferably added in an amount in the range of 1,000~10,000 wt %, based on the weight of the polymer of Formula 1. If the amount of the n-butanol is outside this range, the refractive index of the anti-reflective coating falls outside the range of from about 1.4 to about 2.0 and the thickness of the anti-reflective coating cannot be optimized.

If desired, the top anti-reflective coating composition may further comprise from about 1 to about 20 wt % of L-proline, based on the weight of the polymer of Formula 1. The L-proline acts to further inhibit the diffusion of an acid toward the unexposed region.

A method for forming a pattern of a semiconductor device, comprises (a) applying a photoresist to a semiconductor substrate on which a particular structure has been previously formed; (b) applying the top anti-reflective coating composition on top of the photoresist, and baking to form a top anti-reflective coating; and (c) exposing the photoresist to light, and developing the exposed photoresist to form a photoresist pattern.

The disclosed pattern formation method is characterized in that the anti-reflective coating formed on top of the photoresist is formed of the disclosed top anti-reflective coating composition. Since the top anti-reflective coating has a refractive index in the range of from about 1.4 to about 2.0, the reflectance at the top of the photoresist can be minimized. Accordingly, the photoresist pattern formed by the disclosed method has greatly improved pattern uniformity.

The baking is preferably carried out in the range of 70° C. to 200° C.

The anti-reflective coating composition and the pattern formation method are mainly applied to a process for forming an ultrafine pattern using an ArF light source (193 nm). Likewise, they can be applied to a process for forming an ultrafine pattern using a light source (e.g., F2 or EUV) having a shorter wavelength, so long as water can be used as a medium for the light source. The exposure using the light source is preferably achieved with an exposure energy of 0.1 to 50 mJ/cm$^2$.

In the disclosed pattern formation method, the developing can be carried out by using an alkaline developing solution. As a particularly preferred alkaline developing solution, a 0.01~5% (w/w) solution of tetramethylammoniumhydroxide (TMAH) is used.

In still another aspect, the disclosed top anti-reflective coating composition is used in the fabrication of a semiconductor device. Since the disclosed top anti-reflective coating composition can minimize scattered reflection, it can be applied to various processes for fabricating semiconductor devices, in addition to the formation process of an ultrafine pattern.

It can be appreciated that the disclosed top anti-reflective coating composition can be applied to a variety of processes in ways obvious to those skilled in the art, depending on the type of the processes. Accordingly, the detailed explanations concerning the application of the anti-reflective coating composition to the fabrication of semiconductor devices are omitted.

BRIEF DESCRIPTION OF THE DRAWINGS

The above and other features of the disclosed coating compositions and methods will be more clearly understood from the following detailed description taken in conjunction with the accompanying drawing, wherein.

DETAILED DESCRIPTION OF THE PRESENTLY PREFERRED EMBODIMENTS

Figure 1:
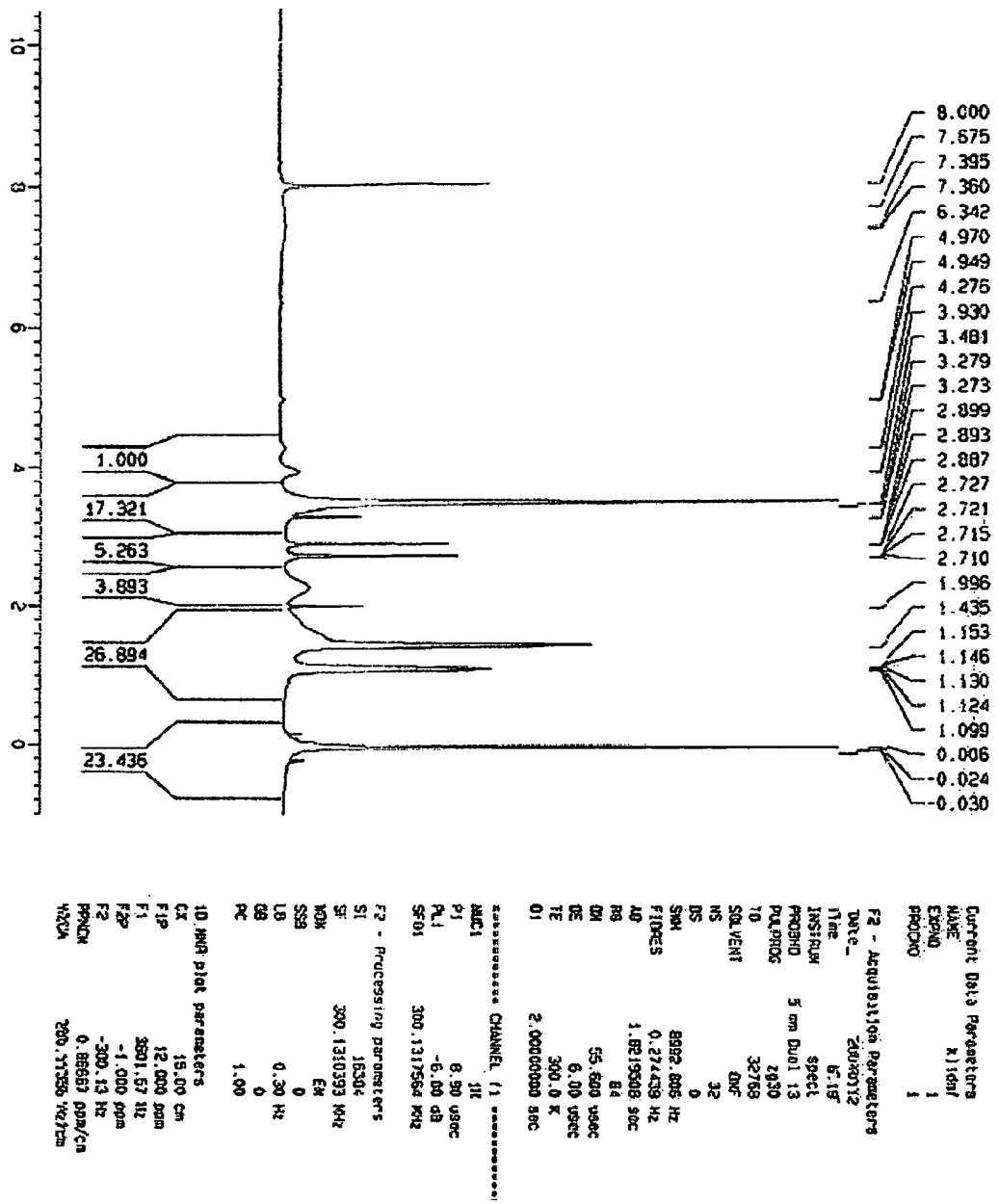
FIG. 1 is a $^1$H-NMR spectrum of a top anti-reflective coating polymer prepared in Example 1 below.

The disclosed coatings, compositions and methods will now be described in more detail with reference to the following examples. However, these examples are given for the purpose of illustration and are not to be construed as limiting the scope of this disclosure.

EXAMPLE 1

Preparation of Top Anti-Reflective Coating Polymer 10 g of t-butylacrylate, 4 g of acrylic acid, 6 g of N-isopropylacrylamide and 0.4 g of AIBN were added to 200 g of PGMEA, and were then polymerized at 60° C. for 8 hours. After completion of the polymerization, the mixture was precipitated in ether, filtered, and dried in a vacuum to yield 17 g of poly(t-butylacrylate-acrylic acid-N-isopropylacrylamide) copolymer, as a white solid, represented by Formula 2 below:

Formula 2

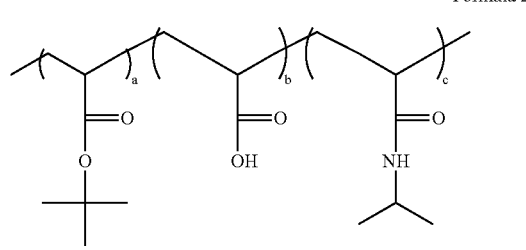

wherein a, b and c represent the mole fraction of each monomer, and are in the range between 0.05 and 0.9.

The structure of the copolymer was identified through 1H-NMR spectrum (FIG. 1).

EXAMPLE 2

Preparation of Top Anti-Reflective Coating Composition 2.5 g of the polymer prepared in Example 1, and 0.04 g of L-proline, which is an amino acid, were dissolved in 100 g of n-butanol to give a top anti-reflective coating composition for use in immersion lithography.

EXAMPLE 3

Formation of Anti-Reflective Coating

The top anti-reflective coating composition prepared in Example 2 was coated on a wafer at 2,000 rpm to form an anti-reflective coating. The thickness, light transmission (at 193 nm), and refractive index of the anti-reflective coating were shown to have 43 nm, 89%, and 1.58, respectively.

EXAMPLE 4

Formation of Top Anti-Reflective Coating

The top anti-reflective coating composition prepared in Example 2 was coated on a photosensitive film (AR1221J, JSR) having a thickness of 220 nm at 2,000 rpm to form a top anti-reflective coating having a thickness of 264 nm. It was confirmed that the disclosed top anti-reflective coating composition does not dissolve the photosensitizer.

EXAMPLE 5

Water Solubility Test

The wafer on which the photoresist and the top anti-reflective coating were formed was immersed in liquid, distilled water for about 5 minutes, and dried. The resulting structure was measured to have a thickness of 264.7 nm, which is larger by about 0.7 nm than that before the immersion in water. This result reveals that the top anti-reflective coating composition was substantially neither dissolved nor swollen in water.

EXAMPLE 6

Solubility Test in Developing Solution

The wafer on which the photoresist and the top anti-reflective coating were formed was developed with a 2.38 (w/w) TMAH developing solution for about one minute, and washed with distilled water. The resulting structure was measured to have a thickness of 220 nm. This indicates that the top anti-reflective coating composition was completely dissolved by the developing solution.

As apparent from the above description, the disclosed top anti-reflective coating formed using the anti-reflective coating polymer satisfies the following requirements for use in immersion lithography. First, since the top anti-reflective coating has a light transmission of 89% or higher, it is transparent to a light source. Second, the top anti-reflective coating has a refractive index between 1.4 and 2.0. Third, the top anti-reflective coating composition does not dissolve the photosensitive film. Fourth, the top anti-reflective coating is not soluble in water upon light exposure. Finally, the top anti-reflective coating is highly soluble in a developing solution upon development.

Therefore, the disclosed top anti-reflective coatings can be applied to immersion lithography, and can reduce the reflectance at the top of the photoresist, thus minimizing the alteration of CD.

As a result, the disclosed top anti-reflective coatings enable the formation of a fine photoresist pattern, thus contributing to the fabrication of sub-50 nm semiconductor devices.

Although the preferred embodiments have been disclosed for illustrative purposes, those skilled in the art will appreciate that various modifications, additions and substitutions are possible, without departing from the scope and spirit of this disclosure and the accompanying claims.

What is claimed is:

1. A top anti-reflective coating composition comprising an effective amount of a top anti-reflective coating polymer having a weight-average molecular weight of 1,000~1,000,000 dissolved in n-butanol, said polymer being represented by Formula 1 below:

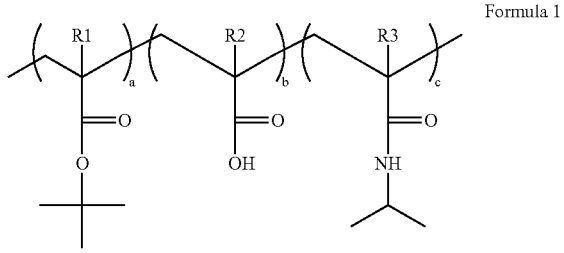

Formula 1 wherein R1, R2 and R3 are independently hydrogen or a methyl group; and a, b and c represent the mole fraction of each monomer and are in a range of from about 0.05 to about 0.9.

2. The composition of claim 1, wherein the composition is prepared by dissolving the polymer in 1,000~10,000 wt % of n-butanol, based on the weight of the polymer.

3. The composition according to claim 1, further comprising from about 1 to about 20 wt % of L-proline, based on the weight of the polymer.

4. The composition of claim 1, wherein the top anti-reflective coating composition has a refractive index in the range of from about 1.4 to about 2.0.

5. The composition of claim 1, wherein the composition is used to fabricate a semiconductor device.

6. A method for forming a pattern of a semiconductor device, comprising:
   (a) applying a photoresist to a semiconductor substrate on which a particular structure has been previously formed;
   (b) applying the top anti-reflective coating composition of claim 1 on top of the photoresist and baking the same to form a top anti-reflective coating; and
   (c) exposing the photoresist to light, and developing the exposed photoresist to form a photoresist pattern.

7. The method according to claim 6, wherein the baking is carried out at a temperature ranging from about 70° C. to about 200° C.

8. The method of claim 6, wherein a liquid is used as a medium for a light source in the exposure step.

9. The method of claim 6, wherein water is used as a medium for a light source in the exposure step.

10. The method according to claim 6, wherein the developing is carried out by using from about a 0.01 to about a 5 wt % solution of tetramethylammoniumhydroxide (TMAH).

* * * * *